(12) United States Patent
Sheng et al.

(10) Patent No.: US 7,054,606 B1
(45) Date of Patent: May 30, 2006

(54) DIGITALLY CALIBRATED NARROWBAND FILTER WITH ANALOG CHANNEL COMPENSATION

(75) Inventors: Samuel W. Sheng, San Jose, CA (US); Lapoe E. Lynn, Cupertino, CA (US); Ivan C-Y Eng, Santa Clara, CA (US)

(73) Assignee: LSI Logic Corporation, Milpitas, CA (US)

( * ) Notice: Subject to any disclaimer, the term of this patent is extended or adjusted under 35 U.S.C. 154(b) by 505 days.

(21) Appl. No.: 09/960,560

(22) Filed: Sep. 21, 2001

(51) Int. Cl.
*H04Q 7/20* (2006.01)

(52) U.S. Cl. .................... 455/306; 455/187.1; 455/213; 455/113

(58) Field of Classification Search ............... 455/108, 455/110–113, 119–120, 183.2, 184.1–185.1, 455/226.1, 247.1, 311, 63.1, 553.1, 187.1, 455/189.1, 191.1, 210, 213, 306–308; 375/232–233, 375/345; 348/731–733

See application file for complete search history.

(56) References Cited

U.S. PATENT DOCUMENTS

| | | | | |
|---|---|---|---|---|
| 4,685,150 A | | 8/1987 | Maier ........................ 455/183 |
| 5,489,879 A | * | 2/1996 | English ..................... 332/103 |
| 5,822,687 A | * | 10/1998 | Bickley et al. .......... 455/226.1 |
| 5,940,441 A | * | 8/1999 | Cranford et al. ............ 375/232 |
| 5,987,314 A | * | 11/1999 | Saito ....................... 455/226.1 |
| 6,002,717 A | * | 12/1999 | Gaudet ....................... 375/232 |
| 6,032,028 A | * | 2/2000 | Dickey et al. .............. 455/110 |
| 6,055,269 A | * | 4/2000 | Drost et al. ................. 375/232 |
| 6,823,028 B1 | * | 11/2004 | Phanse ....................... 375/345 |

* cited by examiner

*Primary Examiner*—Jean Gelin
(74) *Attorney, Agent, or Firm*—Christopher P. Maiorana P.C.

(57) ABSTRACT

An apparatus comprising a first circuit, a second circuit and a third circuit. The first circuit may be configured to filter an analog input signal in an analog domain in response to one or more control signals. The second circuit may be configured to convert the analog input signal to a digital signal. The third circuit may be configured to generate the control signals in response to the digital signal. The third circuit may also be configured to control skewing of the analog input signal within the first circuit to partially compensate for frequency dependent effects associated with a transmission medium.

20 Claims, 5 Drawing Sheets

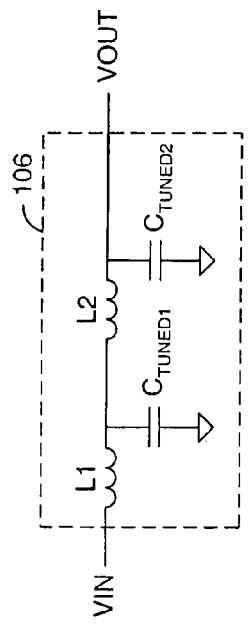
FIG. 3
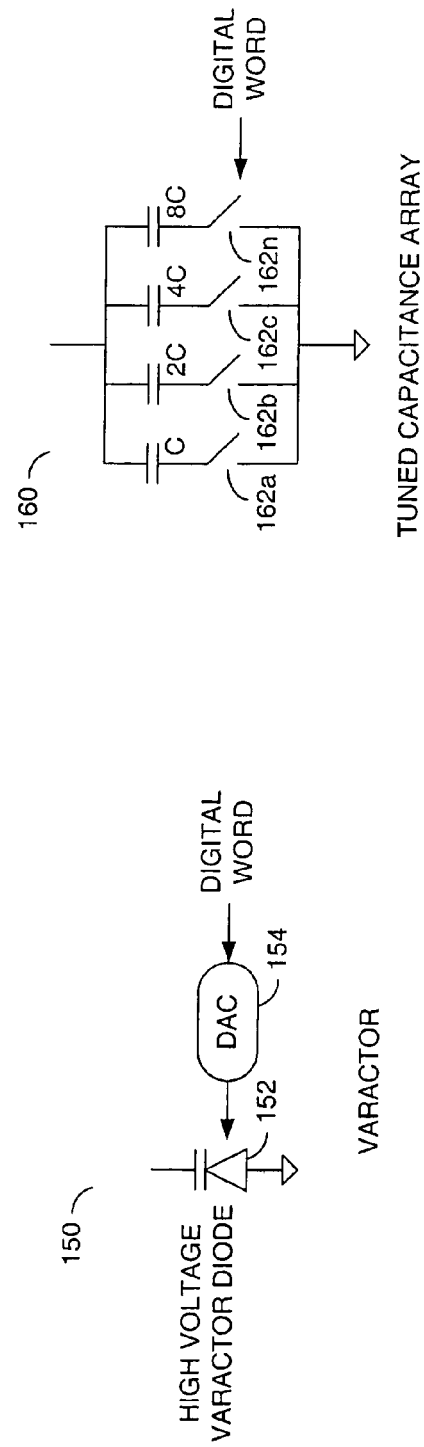
FIG. 5
FIG. 4

DIGITALLY CALIBRATED NARROWBAND FILTER WITH ANALOG CHANNEL COMPENSATION

FIELD OF THE INVENTION

The present invention relates to a method and/or architecture for implementing an isolation filter generally and, more particularly, to a method and/or architecture for digitally calibrated narrowband filters with analog channel compensation.

BACKGROUND OF THE INVENTION

Conventional communication systems often require a form of channel selection (or isolation filtering) in the receiver signal path. For example, in a television system, a single desired channel must be accurately selected from potentially hundreds of channels. Likewise, in a cellular receiver, the handset must first isolate and filter out signals from other systems such as pagers or incompatible competing voice services. Such isolation of signals mitigates the effect of blocking/desensitizing out-of-band signals and aids in maximizing overall receiver performance.

Such conventional filters typically are implemented with discrete, high-performance external components (e.g., surface acoustic wave or ceramic filters), owing to the need for accurate filter response and center frequency, as well as stability over time and temperature. However, such precision external components can be large and expensive. U.S. Pat. No. 5,822,687 and U.S. Pat. No. 4,685,150 disclose methods for accomplishing electronic filter tuning.

It may be desirable to implement inexpensive, low-tolerance external components coupled with highly integrated silicon processing to compensate for channel equalization, process variation, inaccuracies and drift.

SUMMARY OF THE INVENTION

The present invention concerns an apparatus comprising a first circuit, a second circuit and a third circuit. The first circuit may be configured to filter an analog input signal in an analog domain in response to one or more control signals. The second circuit may be configured to convert the analog input signal to a digital signal. The third circuit may be configured to generate the control signals in response to the digital signal. The third circuit may also be configured to control skewing of the analog input signal within the first circuit to partially compensate for frequency dependent effects associated with a transmission medium.

The objects, features and advantages of the present invention include providing a method and/or architecture for digitally calibrated narrowband filters with analog channel compensation that may (i) skew the filter in a controlled fashion (via a calibration process), (ii) partially or completely compensate for frequency-dependent effects associated with the transmission medium, (iii) compensate for any process variation and/or (iv) compensate for channel equalization.

BRIEF DESCRIPTION OF THE DRAWINGS

These and other objects, features and advantages of the present invention will be apparent from the following detailed description and the appended claims and drawings in which:

FIG. 3 is a detailed block diagram of a filter of FIGS. 1 and 2;

FIG. 4 is a schematic of a typical tunable capacitor circuit using a varactor;

FIG. 5 is a schematic of a digitally switched tunable capacitor array of the present invention;

DETAILED DESCRIPTION OF THE PREFERRED EMBODIMENTS

Figure 1:
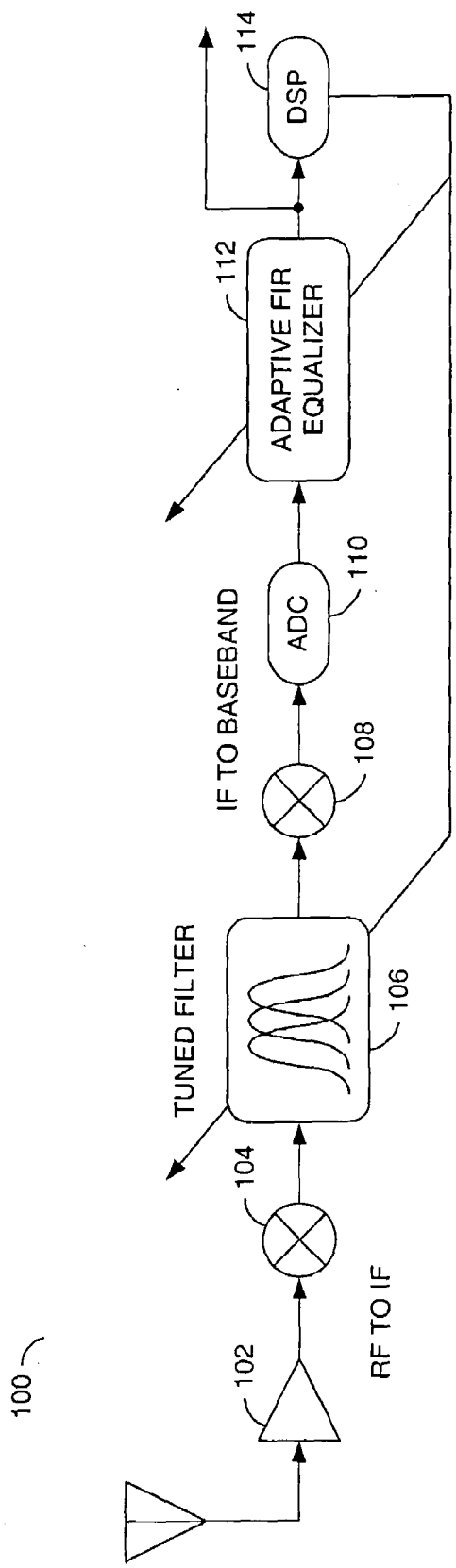
FIG. 1 is a block diagram of a preferred embodiment of the present invention.

Referring to FIG. 1, a block diagram of a circuit (or system) 100 is shown in accordance with a preferred embodiment of the present invention. The circuit 100 may implement a digitally-calibrated narrowband filter with analog channel compensation. The circuit 100 may illustrate an exemplary implementation of the present invention.

The circuit 100 generally comprises a buffer 102, a mixer 104, a filter 106, a mixer 108, a conversion circuit 110, an equalizer circuit 112 and a processing block 114. In one example, the filter 106 may be implemented as a tuned filter. In another example, the filter 106 may be implemented as a digitally-calibrated narrowband filter with analog channel compensation. The conversion circuit 110 may be implemented as an analog to digital conversion circuit. The equalizer circuit 112 may be implemented as an adaptive finite-impulse response (FIR) equalizer circuit. The processing circuit 114 may be implemented as a digital signal processing (DSP) block. The DSP block (or circuit) 114 may be implemented to optimize channel response. The DSP block 114 may be configured to offset the filter 106 to maximize SNR in the signal. For example, the DSP block 114 may be configured to adapt tuning code of the tuned filter 106 and the digital filter 112 to optimize channel response. The DSP circuit 114 may control the filter 106.

By deliberately skewing the filter 106 in a controlled fashion (e.g., via calibration) from the DSP 114, the circuit 100 may partially compensate for frequency-dependent effects associated with the transmission medium (e.g., coax, fiber, etc.). The transmission medium for communication systems is generally flawed. In particular, the medium typically attenuates the signal and introduces frequency-dependent effects such as dispersion. Using conventional approaches, such effects are typically compensated for in the digital domain, using extremely complex finite-impulse response adaptive equalizers. By placing all of the equalization burden in the digital domain, the required dynamic range in the analog-to-digital converter 110 is increased. Purely digital processing also requires potentially hundreds of taps in the FIR equalizer 112. With the present invention, the digital signal processor 114 may control filter tuning of the tuned filter 106, providing partial adaptation to the channel 112 in the analog domain, potentially minimizing the precision needed in the analog-to-digital converter 110. The partial analog processing may also reduce the number of taps needed in the subsequent digital FIR 112.

Figure 2:
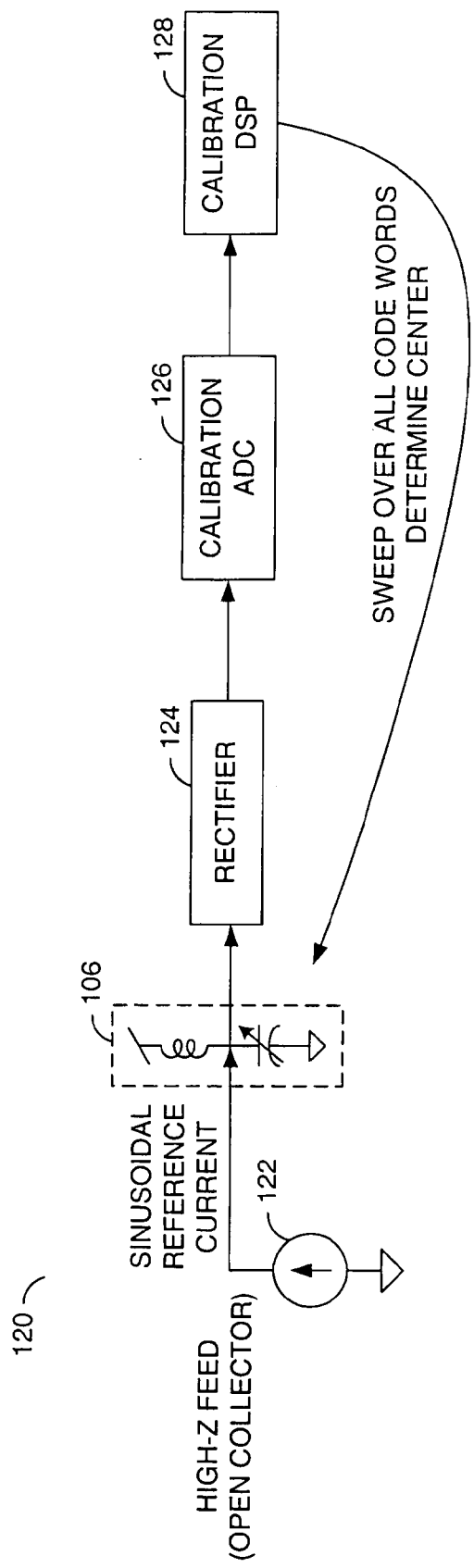
FIG. 2 is a block diagram of a filter of FIG. 1 along with a calibration circuit.

Referring to FIG. 2, a block diagram of a calibration circuit 120 is shown. The calibration circuit 120 may be configured to calibrate the filter 106. The circuit 120 generally comprises a block (or circuit) 122, a block (or circuit)

Figure 6:
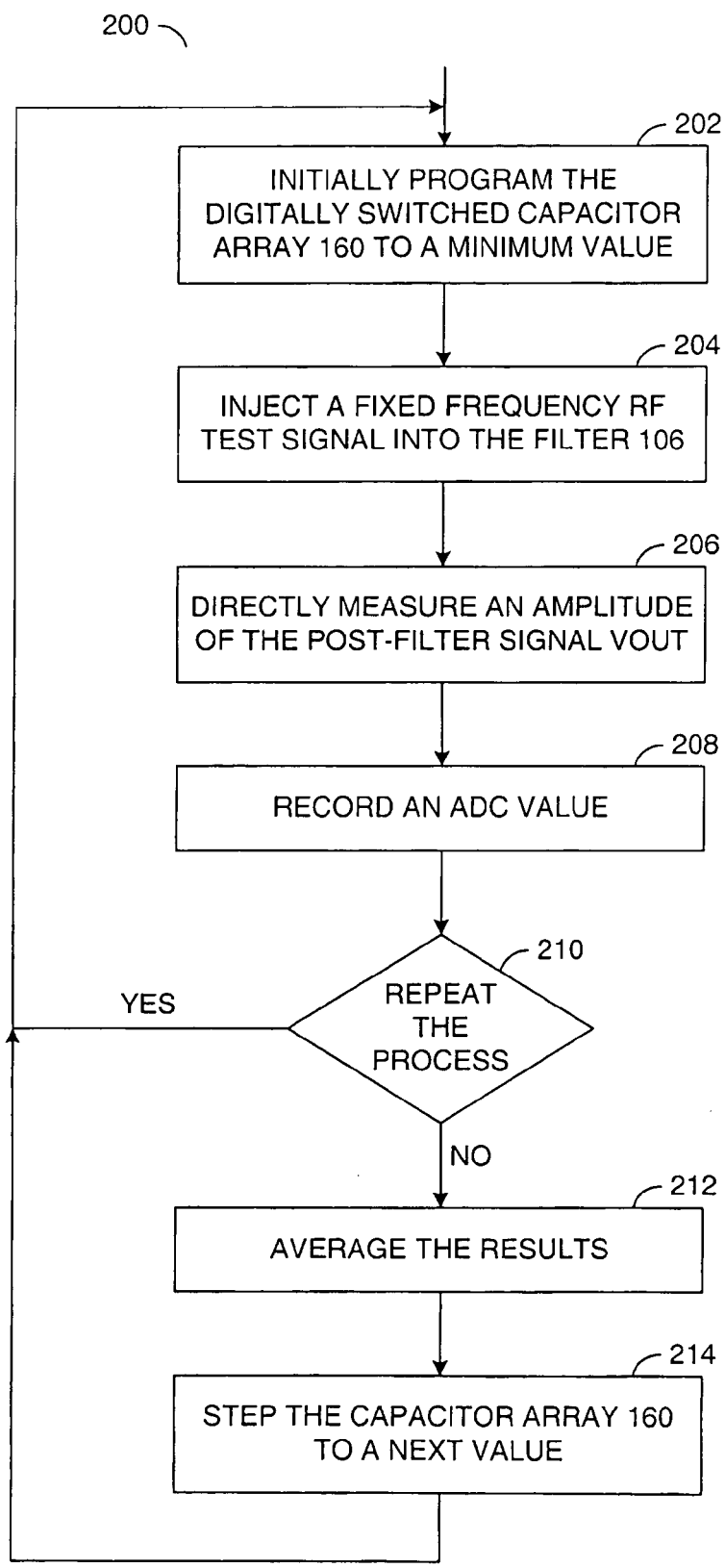
FIG. 6 is a flow diagram illustrating a first calibration operation of the present invention.

124, a block (or circuit) 126, a block (or circuit 128) and the filter 106. The circuit 122 may be a current source configured to inject a reference current into the filter 106. The circuit 122 may be implemented as a hi-z feed via an open collector. The reference current may be a sine wave at an appropriate frequency, which may be a center frequency of the filter 106. The filter 106 is shown comprising one or more inductors and one or more programmable (or variable) capacitors (to be described in more detail in connection with FIG. 3). The circuit 124 may be implemented as a rectifier circuit. The circuit 126 may be implemented as a calibration analog-to-digital converter (ADC) circuit. The ADC 110 and the ADC 126 may be independently implemented. The calibration DSP 128 may provide a sweep over all code words to determine a center frequency. The circuit 128 may be implemented as a calibration DSP circuit configured to calibrate the filter 106. Furthermore, the DSP 128 may be configured to control the filter 106 and determine a center frequency and skew. The DSP 114 and the DSP 128 may or may not be independently implemented. However, the DSP 114 may be configured to measure SNR and skew the filter 106 to maximize SNR based on the signal, while the calibration DSP 128 may be configured to perform a first phase of calibration (as shown in FIG. 6). The calibration DSP 128 does not generally measure SNR but may attempt to center the filter 106 using a calibrated sine wave.

Referring to FIG. 3, a more detailed diagram of the filter 106 is shown comprising an inductor L1, an inductor L2, a tuned capacitor Ctuned1 and a tuned capacitor Ctuned2. By tuning the capacitor Ctuned1 and Ctuned2, the filter 106 provides the desired filtering effect.

Referring to FIG. 4, a typical tunable/programmable calibration circuit 150 is shown. The circuit 150 generally comprises a varactor diode 152 and a digital-to-analog (DAC) converter 154. A digital output (e.g., DIGITAL_WORD) of a calibration engine may be fed into the DAC 154. The DAC 154 may be configured to drive one (or more) varactors 154 to control the filter response. In general, high quality varactors with wide tuning ranges are difficult to integrate in silicon, since such varactors require high voltages (e.g., voltage>3V). Varactors may be subject to drift over temperature and time. The varactor calibration scheme 150 may be undesirable, since varactors may (i) need a large supply voltage to achieve tuning range, which may limit silicon integrability and (ii) be significantly altered by temperature and process drift.

Referring to FIG. 5, a switched capacitor array calibration scheme 160 is shown. The calibration scheme 160 generally comprises a capacitor (e.g., C), a capacitor (e.g., 2C), a capacitor (e.g., 4C), a capacitor (e.g., 8C) and a number of switches 162a–162n. The capacitors are shown implemented in a binary weighted manner. However, other weighting schemes (e.g., linear weighted, etc.) may be implemented accordingly to meet the design criteria of a particular implementation. Since the temperature drift of the capacitors may be negligible, a wide tuning range may be achieved by increasing the number of capacitors and switches in the array.

The circuit 160 may implement capacitors that may be switched. The switchable capacitors may reduce temperature dependence and process sensitivity. Such a configuration may also increase a tuning range of the filter 106. Additionally, since the circuit 160 may be controlled by digital switches, the circuit 160 may be easily integrated to silicon.

Referring to FIG. 6, a process (or method) 200 for implementing a precise tuning operation of the present invention is shown. The process 200 may be configured to perform a first phase of calibration. The process 200 may be configured to center the filter 106. The process 200 generally comprises a state 202, a state 204, a state 206, a state 208, a decision state 210, a state 212 and a state 214. In the state 202, the digitally-switched capacitor array 160 may be initially programmed to minimum capacitance value. In the state 204, a single fixed-frequency RF sinusoidal test signal may be injected into the filter 106 at the filter input. In the state 206, the rectifier circuit 124, coupled to the A/D converter 126 may directly measure amplitude of the post-filter signal. The output of the ADC 126 may be recorded at the state 208. In the state 210, the measurement (e.g., signal injection, rectification, and A/D conversion) may be done multiple times. The state 212 may average the results from the state 210 to minimize the impact of thermal noise. The state 214 may step the capacitor array to the next value. The process is repeated as needed.

Figure 7:
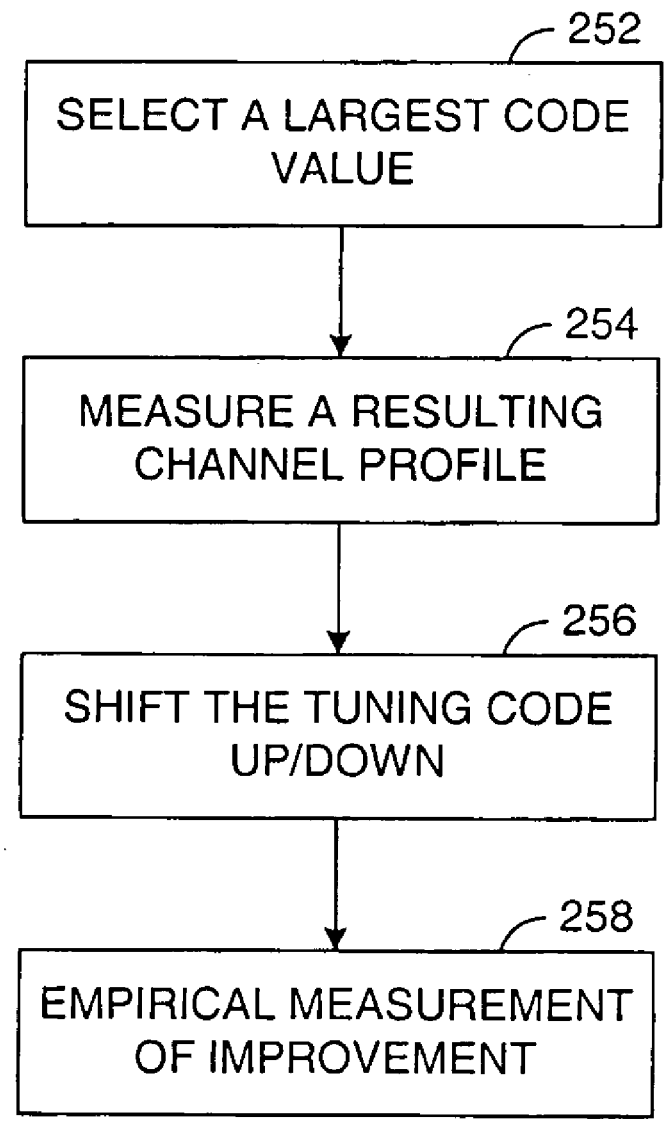
FIG. 7 is a flow diagram illustrating a second calibration operation of the present invention.

Referring to FIG. 7, a process (or method) 250 illustrating an operation of the present invention is shown. The process 250 may be configured as a second phase of calibration. The process 250 may be configured to skew the filter 106 to compensate for the channel. The process 250 generally comprises a state 252, a state 254, a state 256 and a state 258. All codes for the capacitor are scanned and recoded in memory in this fashion. After all codes for the capacitor have been measured, the largest value is selected. Due to parasitics and package effects, multiple peaks may be present, so a simple peak detection may not be practical to implement. In the case of multiple peaks that are close in value, a heuristic method dependent on process and filter topology must be used to select the "peak" value.

In particular, in the state 252, the smallest capacitor code with the largest measured output amplitude is chosen. This will maximize the impedance of the shunt-resonant filter. Given this "center" code, in the state 254 the baseband DSP then measures the resulting channel profile either by a bit-error-rate measurement, or by observing the convergence behavior of the adaptive channel equalizer. In the state 256, the DSP engine 114 may then shift the tuning code up or down (usually no more than several LSBs) to improve the channel response. In the state 258, the measure of improvement is usually done empirically. The DSP 114 can quickly scan 2–3 LSBs on either side of the reported center code. The required computation may precalculate the exact filter code shift. However, such computation, in certain cases, may actually take more time than to simply measure all possible codes. Therefore, the present invention may either precalculate the filter code or measure all possible codes.

The function performed by the flow diagrams of FIGS. 6 and 7 may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, FPGAs, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, and magneto-optical disks, ROMs, RAMs, EPROMs, EEPROMs, Flash memory, magnetic or optical cards, or any type of media suitable for storing electronic instructions.

While the invention has been particularly shown and described with reference to the preferred embodiments thereof, it will be understood by those skilled in the art that various changes in form and details may be made without departing from the spirit and scope of the invention.

The invention claimed is:

1. An apparatus comprising:
   a first circuit configured to filter an analog input signal in an analog domain in response to one or more control signals, wherein said first circuit includes a digitally switched capacitor array configured to (i) sweep over code values and (ii) determine a certain value for a filter;
   a second circuit configured to convert said analog input signal to a first digital signal; and
   a third circuit configured to generate (i) a second digital signal and (ii) said one or more control signals in response to said first digital signal, wherein said third circuit is configured to deliberately skew the filter tuning of the analog input signal within the first circuit in response to a signal to noise ratio of said first digital signal to partially compensate for frequency dependent effects associated with a transmission medium.

2. The apparatus according to claim 1, wherein said third circuit includes a first processor configured to generate said one or more control signals.

3. The apparatus according to claim 2, wherein said first circuit comprises:
   a current source;
   a second processor;
   a rectifier; and
   a analog-to-digital converter, wherein said digitally switched capacitor array circuit, said rectifier, said second processor and said analog-to-digital converter are configured to sweep over code values and determine a center value for said filter.

4. The apparatus according to claim 1, wherein said third circuit is further configured to provide back-end digital processing control over said first circuit.

5. The apparatus according to claim 4, wherein said first circuit is further configured to provide partial adaptation of said analog input signal in said analog domain.

6. The apparatus according to claim 1, wherein said first circuit comprises:
   said filter configured to tune said analog input signal; and
   a processor configured to calibrate said filter to a center frequency prior to said deliberate skewing.

7. The apparatus according to claim 6, wherein said third circuit is further configured to offset said center frequency of said filter.

8. The apparatus according to claim 1, wherein:
   said first circuit comprises a analog tuned filter;
   said second circuit comprises a analog-to-digital conversion circuit; and
   said third circuit comprises (a) an equalizer circuit and (b) a digital signal processing device configured to (i) generate said control signals and (ii) adapt a tuning code of said equalizer circuit.

9. The apparatus according to claim 8, wherein said third circuit further comprises:
   an adaptive filter-impulse response (FIR) equalizer circuit configured to generate said second digital signal in response to said first digital signal and said one or more control signals.

10. The apparatus according to claim 9, wherein said apparatus is configured to reduce the dynamic range needed in said analog-to-digital converter circuit by said deliberate skewing of said analog input signal.

11. The apparatus according to claim 10, wherein said deliberate skewing reduces the number of taps needed in said FIR equalizer circuit.

12. An apparatus comprising:
   means for tuning an analog input signal in an analog domain in response to one or more control signals, wherein said means for tuning includes a digitally switched capacitor array configured to (i) sweep over code values and (ii) determine a certain value for a filter;
   means for converting said analog input signal to a digital signal; and
   means for generating (i) a second digital signal and (ii) said one or more control signals in response to said first digital signal, wherein said means for generating is configured to deliberately skew the analog input signal within said means for tuning in response to measuring a signal to noise ratio of said first digital signal to partially compensate for frequency dependent effects associated with a transmission medium.

13. A method for controlling skewing of an input signal to partially compensate for frequency dependent effects associated with a transmission medium comprising the steps of:
   (A) tuning said input signal in an analog domain in response to one or more control signals;
   (B) sweeping over code values with a digitally switched capacitor array;
   (C) determining a center value with said digitally switched capacitor array for a filtering device;
   (D) converting said input signal to a digital signal;
   (E) measuring a signal to noise ratio of said digital signal; and
   (F) generating (i) a second digital signal and (ii) said one or more control signals in response to said digital signal to deliberately skew said input signal in response to said signal to noise ratio to control filtering to partially compensate for frequency dependent effects associated with a transmission medium.

14. The method according to claim 13, wherein step (A) further comprises:
   providing partial adaption of said input signal in the analog domain.

15. The method according to claim 13, wherein step (A) further comprises:
   filtering said input signal with said filtering device; and
   calibrating said filtering device to a center frequency prior to said skewing.

16. The method according to claim 15, wherein step (A) further comprises:
   controlling an offset of said filtering device.

17. The method according to claim 13, wherein step (E) further comprises:

generating said second digital signal with an adaptive filter-impulse response filter (FIR) equalizer.

18. The method according to claim 17, further comprising the step of:

generating said control signals with a digital signal processing device.

19. The method according to claim 18, further comprising the step of:

adapting a tuning code of said filtering and said FIR equalizer with said digital signal processing device to optimize a channel response.

20. The method according to claim 19, further comprising the step of:

partially adapting said tuning code of said filtering device in said analog domain.

* * * * *